United States Patent [19]

McCaleb

[11] Patent Number: 4,645,919

[45] Date of Patent: Feb. 24, 1987

[54] PHOTOSENSITIVE MOTION DETECTOR APPARATUS

[76] Inventor: Robert E. McCaleb, 5704 NE. 36th Ave., Portland, Oreg. 97211

[21] Appl. No.: 698,228

[22] Filed: Feb. 4, 1985

[51] Int. Cl.[4] ............................................. H01J 40/14
[52] U.S. Cl. ................................ 250/214 B; 250/205; 250/214 RC; 250/221
[58] Field of Search ............ 250/214 R, 214 A, 214 B, 250/214 RC, 205, 206, 221

[56] References Cited

U.S. PATENT DOCUMENTS 4,032,777 6/1977 McCaleb ...................... 250/214 RC

*Primary Examiner*—Edward P. Westin
*Attorney, Agent, or Firm*—Jack E. Day

[57] ABSTRACT

An improved photosensitive motion detector which detects abrupt changes within a field of view while ignoring gradual changes in ambient lighting therein. In addition, sensitivity to such changes is maintained without regard to the intensity level of the ambient light, and is not sensitive to the "flickering" of fluorescent lamps. Light from said field of view, which can contain an abrupt discontinuity therein, is focussed upon two substantially identical photocells, each of which is in parallel with one of two substantially identical photoresistors, each of which is closely optically coupled to one of two LEDs connected in parallel but in reverse polarity from a common junction to a common potential. Any imbalance between said two photocells is amplified by an operational amplifier and applied to said common junction between said two LEDs in such a way that increased light is cast by one LED upon the photoresistor in parallel with the photocell which receives the least light, and reduced light is cast by the other LED upon the photoresistor which receives the most light, both from the field of view. This balances the parallel resistance of the two circuit halves, and maintains a constant potential at said common junction, which is connected through a low impedance amplifier to an output terminal. Surveillance and/or recording equipment focussed on the field of view are triggered by voltages which have been developed by rapid changes in ambient light, or in the balance of light, from said field of view.

4 Claims, 5 Drawing Figures

PHOTOSENSITIVE MOTION DETECTOR APPARATUS

FIELD OF THE INVENTION

This invention relates generally to photosensitive motion detecting apparatus for detecting abrupt changes within a field of view, and more particularly to an improved photosensitive motion detecting apparatus which detects abrupt changes within a field of view while ignoring gradual changes in ambient lighting within the same field of view, and in addition maintains its sensitivity to such changes without regard to the lighting situation.

BACKGROUND OF THE INVENTION

This invention is an improvement over that disclosed in U.S. Pat. No. 4,032,777 granted to the same inventor, and the brief survey of monitoring devices and their shortcomings contained therein is applicable to the present invention. Although the monitoring device disclosed therein is adequate for many uses, it has been found to provide less than satisfactory operation in the presence of gaseous discharge lighting equipment, such as flourescent lights, and in low levels of light intensity.

As is well-known to those skilled in the art, gaseous discharge lighting devices actually turn "on" and "off" at a rate equal to twice the frequency of the power line frequency. Although this causes "flicker", it is not noticed by most individuals because it is substantially higher in frequency than the response of the optic nerves. However, it can cause eyestrain, problems when taking motion pictures or working with rotating machinery or rapidly moving elements and, under certain conditions of light intensity and/or circuit sensitivity, the circuit of the invention disclosed in U.S. Pat. No. 4,032,777 may respond erratically or inappropriately to the aforementioned flicker of said gaseous discharge lighting devices.

The improved circuitry of the present invention does not exhibit these problems.

SUMMARY OF THE PRESENT INVENTION

The motion detector apparatus of the present invention projects light from the field of view of interest upon a dual, or center-tapped, photosensitive device, or upon two adjacent more-or-less identical photosensitive devices which, for convenience, will henceforth be referred to as photocell devices. The division of light upon each half can be, but does not have to be, equal.

The dual photocell device aforementioned is connected between two different voltage sources, typically negative and positive voltage sources, in parallel with two identical and optically isolated photosensitive devices which, for convenience, will be referred to as photoresistors henceforth. The center-tap of the dual photocell and the output of the circuit of the invention are connected to the junction between the two photoresistors. Each of these latter is optically coupled to one of a pair of light-emitting unidirectional current elements (which, for convenience, will henceforth be referred to as LEDs) connected in series, the common junction between the two being connected to the output of an operational amplifier, and the other ends of the LEDs being connected to a common potential or ground.

A low-pass filter having first, second and third terminals, has its first terminal connected to the output of the circuit and its third terminal connected to the common potential or ground. The second terminal is connected to the positive input to the aforementioned operational amplifier.

The positive input to the operational amplifier is connected via one leg of the low-pass filter to the junction of the center-tap of the dual photocell device, the common junction between the photoresistors and the output of the circuit of the invention. The negative input to the operational amplifier is connected to the third terminal of the low-pass filter.

In operation, any rapid disturbance of the light output in the field of view of interest is translated into an output voltage pulse, which can be used to actuate recording or surveillance equipment, alarms, or other external equipment. However, a gradual change of light level, such as might be caused by the beginning or ending of daylight, or any change which affects the field of view as a whole will be ignored.

It will be understood by those skilled in the art that, in a circuit such as that disclosed in the aforementioned U.S. Pat. No. 4,032,777, the largest amount of output energy will be available for actuating other equipment if the impedance of the photocell and the photoresistor are equal. The circuit of the present invention performs the function of maintaining equal impedances in the two halves of the circuit so that the sensitivity of the sensor will be maximized.

These and other features and advantages of the present invention will be more readily perceived and understood upon consideration of the following detailed description, taken on conjunction with the accompanying drawings.

DETAILED DESCRIPTION OF THE PRESENT INVENTION

Figure 1:
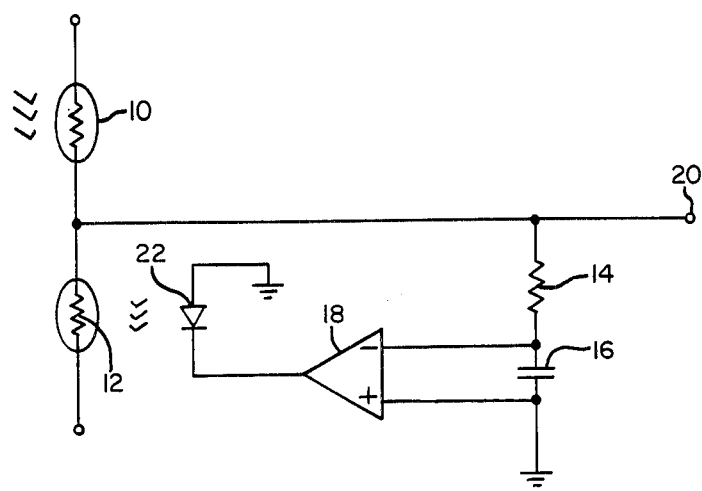
FIG. 1 is the prior art circuit as depicted in FIG. 1 of U.S. Pat. No. 4,032,777 issued to the same inventor, with the reference numerals thereof having been changed herein to correspond to the reference numerals of the present application.

FIG. 1 is the same circuit as that in FIG. 1 of U.S. Pat. No. 4,032,777, which is prior art to this invention, and of which this invention is an improvement. The first photosensitive device 10, hereinafter referred to as photocell 10, and second photosensitive device 12, hereinafter referred to as photoresistor 12, are connected in series between negative and positive voltages −V and +V which, however, could be any two voltages of the appropriate magnitude. Resistor 14 and capacitor 16 comprise a low-pass filter having a first terminal connected to the common point between photocell 10 and photoresistor 12, a second terminal connected to the negative, or inverting, input to operational amplifier 18, and a third terminal connected to the positive input to amplifier 18 and to a common voltage midway between the voltages to which photocell 10 and photoresistor 12 are connected, or to ground. The output of operational amplifier 18 is connected through light-emitting unidirectional current element 22, hereinafter referred to as LED 22, to ground or to the aforementioned midway voltage. LED 22 and photoresistor 12 are closely optically coupled so that virtually all of the light emitted by LED 22 falls upon photoresistor 12, and no light from any other source falls upon photoresistor 12. The low-pass filter of resistor 14 and capacitor 16 has a time constant of RC. Output terminal 20 is connected to the common junction between photocell 10, photoresistor 12 and resistor 14.

The operation of the circuit is as follows: light from an area of interest to be monitored is directed upon photocell 10. Assume the circuit to be placed in a balanced state with output terminal 20 at a potential of 0 V, that is, at the midpoint between the voltages −V or +V, or their equivalent voltages. At this time, the resistances of photocell 10 and photoresistor 12 are equal. If a change in light intensity occurs, which is short with respect to the time constant RC, it will cause a voltage change at terminal 20 which can be used to trigger external equipment as desired. If however, the change in light intensity is long with respect to RC, the voltage change corresponding to it will be passed through resistor 14 to the negative or inverting, input of operational amplifier 18, and will appear in amplified and inverted form at the output terminal of amplifier 18 and across LED 22, in such a way as to track the change in light intensity on photocell 10. Thus, if the light intensity on photocell 10 increases, the voltage across LED 22 will increase, increasing its light output so that the resistance of photoresistor 12 is decreased to equal that of photocell 10, bringing the circuit back into balance. On the other hand, if the light intensity on photocell 10 decreases, the voltage across LED 22 will decrease and reduce its light output, so that the resistance of photoresistor 12 is increased to equal that of photocell 10, restoring the circuit to balance.

It will be seen that the circuit of U.S. Pat. No. 4,032,777 provides output triggers for abrupt changes of light intensity, while ignoring slow changes in ambient light such as might occur, for example, due to the rising and setting of the sun.

However, the circuit does exhibit shortcomings under certain conditions. It will respond, for example, to changes that are too rapid for the eye to follow, such as the flickering of gaseous discharge lighting devices such as are used in florescent fixtures, and thus give spurious responses in certain circumstances if an operator is not aware of this lighting characteristic.

Figure 2:
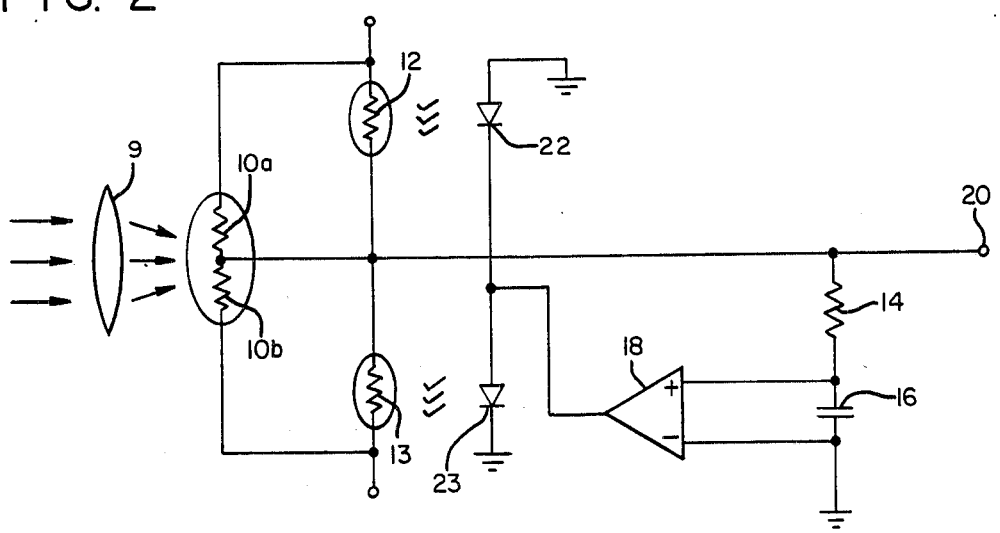
FIG. 2 is the basic circuit diagram of the improved photosensitive motion detector apparatus of the present invention.

The circuit of the present invention, a simplified schematic of which appears in FIG. 2, does not have the shortcomings just enumerated, and provides other benefits and advantages over the circuit of FIG. 1, for example, providing potentially twice the sensitivity, since an image that affects both sensor halves has a "push-pull" effect as it crosses the boundary between the two halves. Identifying numerals for components which perform the same or similar functions as those in FIG. 1 are the same, for consistency and ease of identification and understanding.

In FIG. 2, first photosensitive device 10a, henceforth called photocell 10a, and first identical photosensitive device 10b, henceforth referred to as photocell 10b, has light from the field of view of interest directed upon it. As shown, 10a and 10b could be a dual, or center-tapped, unit, or could also be two identical photocells placed physically side-by-side, without departing from the spirit or intent of the invention.

Photocell 10a/10b is connected between two sources of voltage, −V and +V. Identical, optically isolated photoresistors 12 and 13 are connected in parallel with input photocell 10a/10b, and the center-tap of the latter is connected to the junction between photoresistors 12 and 13 and to output terminal 20. Resistor 14 is connected between output terminal 20 and the positive, or non-inverting, input of operational amplifier 18, and capacitor 16 is connected between the positive and negative inputs of amplifier 18, with the negative, or inverting input being grounded. Resistor 14 and capacitor 16 comprise a low-pass filter with a time constant determined by the RC product. The output of operational amplifier 18 is connected to light-emitting unidirectional current element 22, hereinafter referred to as LED 22, and first identical light-emitting unidirectional current element 23, hereinafter referred to as LED 23. LEDs 22 and 23 are connected in parallel with each other, but in opposite polarity thereto, and are connected between the output of amplifier 18 and ground, to any appropriate voltage midway between voltages to which photocell 10a/10b is connected. LED 22 is closely optically connected to photoresistor 12 and LED 23 is closely optically connected to photoresistor 13. Ideally, all of the light emitted from an LED should be received by the corresponding photoresistor, and a photoresistor should receive no light from any source other than the corresponding LED. As is well known to those skilled in the art, units containing LED photoresistor pairs are easily obtainable.

The circuit disclosed in FIG. 2 can operate with both halves of the photocell 10a/10b being equally illuminated, or it can operate with unequal light intensity on the two sides. First, consider the situation where equal light intensity falls upon both halves of photocell 10a/10b. The voltage on output terminal 20 will be 0 V with the circuit voltages as indicated. If something interrupts the light falling on one-half of photocell 10a/10b, say 10a, the resistance of 10a will increase, tending to drop the potential on output terminal 20. If the change in potential is more rapid than can be discharged by the circuit of resistor 14 and capacitor 16 - is significantly shorter than the RC time constant - a negative voltage pulse will be available at terminal 20 to actuate external apparatus. If, on the other hand, the drop in voltage on the center-tap of 10a/10b is less rapid than the time constant of the circuit, operational amplifier 18 will amplify the signal to produce a negative-going voltage at the junction between LEDs 22 and 23, increasing the brightness of LED 22 and decreasing the brightness of LED 23. Increasing the brightness of LED 22 decreases the resistance of photoresistor 12 thereby decreasing the resistance of the parallel circuit of 12 and 10a; decreasing the brightness of LED 23 increases the resistance of photoresistor 13 thereby increasing the overall resistance of the parallel circuit 13 and 10b, and thereby bringing the resistances of each half of the parallel circuit into balance and maintaining output terminal 20 at 0 V. It will be understood by those skilled in the art that the circuit operates in a similar but inverse manner if the light intensity on 10a were increased, or the light intensity on 10b were decreased, and in the same manner if the light intensity on 10b were increased. Thus it will be understood that the circuit will respond to abrupt changes occurring on one or the other of photocell 10a/10b, by developing an output trigger signal for use elsewhere, but the circuit will not develop such an output trigger signal when the same change occurs on both halves of photocell 10a/10b at the same time, or when the change in light intensity, even though unbalanced, is slower than RC.

Next, consider the situation where the lens 9 focuses a sharp demarcation between light and dark upon the division between the halves of photocell 10a/10b so that, for example, 10a receives little or no light and 10b receives substantial light; 10b will have substantially lower resistance than 10a and thus the center-tap will be at a negative potential. The circuit will come into balance by the negative signal on the center-tap being amplified by operational amplifier 18 and the resultant negative going signal will be applied to the common junction between LEDs 22 and 23. LED 22 will become brighter and LED 23 will become dimmer, decreasing the resistance of photoresistor 12 and increasing the resistance of photoresistor 13, respectively, until the parallel resistance of the two halves of the parallel circuit are equal and the voltage on output terminal 20 is again 0 V. Any change in this quiescent situation will be handled as described hereinbefore: if it is a change short with respect to the time constant RC, it will be passed to external equipment; if it is a change that is long with respect to RC, the circuit will be brought into balance without the external equipment being activated.

One feature of the operation is not apparent upon first examination: the sensitivity of the circuit is greatest when the resistance of the two halves of the circuit is equal, that is, when the parallel resistance of 10a and 12 is equal to the parallel resistance of 10b and 13. As these resistances become unequal, the sensitivity of the circuit to a signal of given amplitude decreases. Consequently, the ability of the circuit of the present invention to keep the resistances of the two halves equal also maintains the sensitivity of the circuit. One particularly valuable aspect of this feature is that the rejection of common-mode signals (those which are applied to both 10a and 10b equally) is maintained as the ambient light level is changed.

Figure 3:
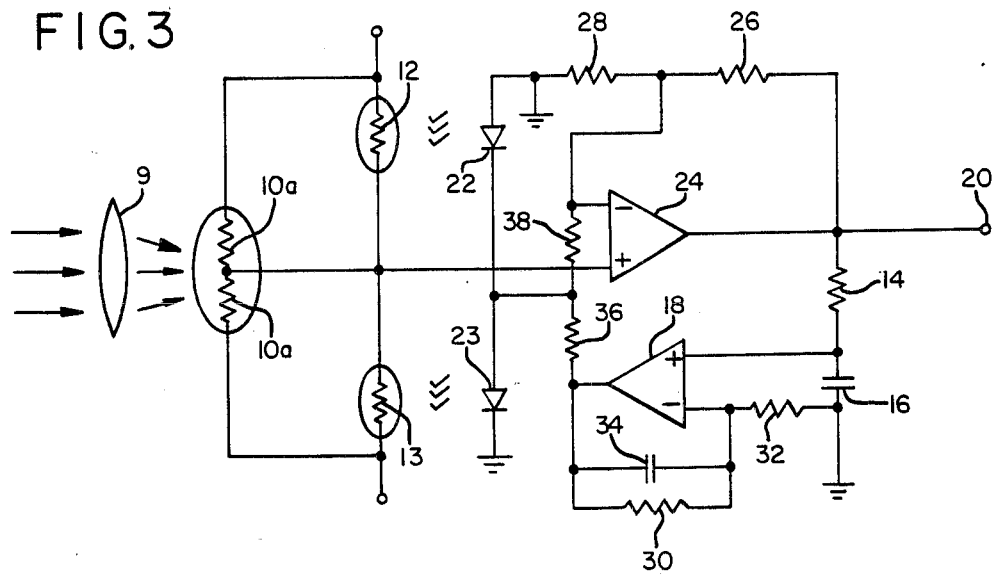
FIG. 3 is a modified embodiment of the circuit of FIG. 2, for the purpose of reducing the output impedance and providing greater energy to actuate external equipment.

In FIG. 3, we see an embodiment of the invention which provides more driving energy for operating external equipment or circuitry than does the previous embodiment disclosed in FIG. 2, while providing greater isolation for the detector portion of the circuit. The same reference numerals are used to refer to the same or similar elements as are used in FIGS. 1 and 2. In this embodiment, low-impedance means 24, herein disclosed as non-inverting amplifier 24, is inserted between the center-tap of photocell 10a/10b and output terminal 20. The gain of amplifier 18 is determined by resistive divider network 30,32; the gain of amplifier 24 is determined by resistive divider network 26,28; and the ratio of the signal fed to LEDs 22 and 23, to the signal fed to the negative input of amplifier 24, is determined by resistive divider network 36,38. Capacitor 34 is for the purpose of integrating the signal appearing between the output and negative input of operational amplifier 18.

It will be seen by those skilled in the art that amplifier 24 gives terminal 20 a low output impedance while presenting the common junction between photoresistors 12 and 13 with a high impedance load.

Figure 4A:
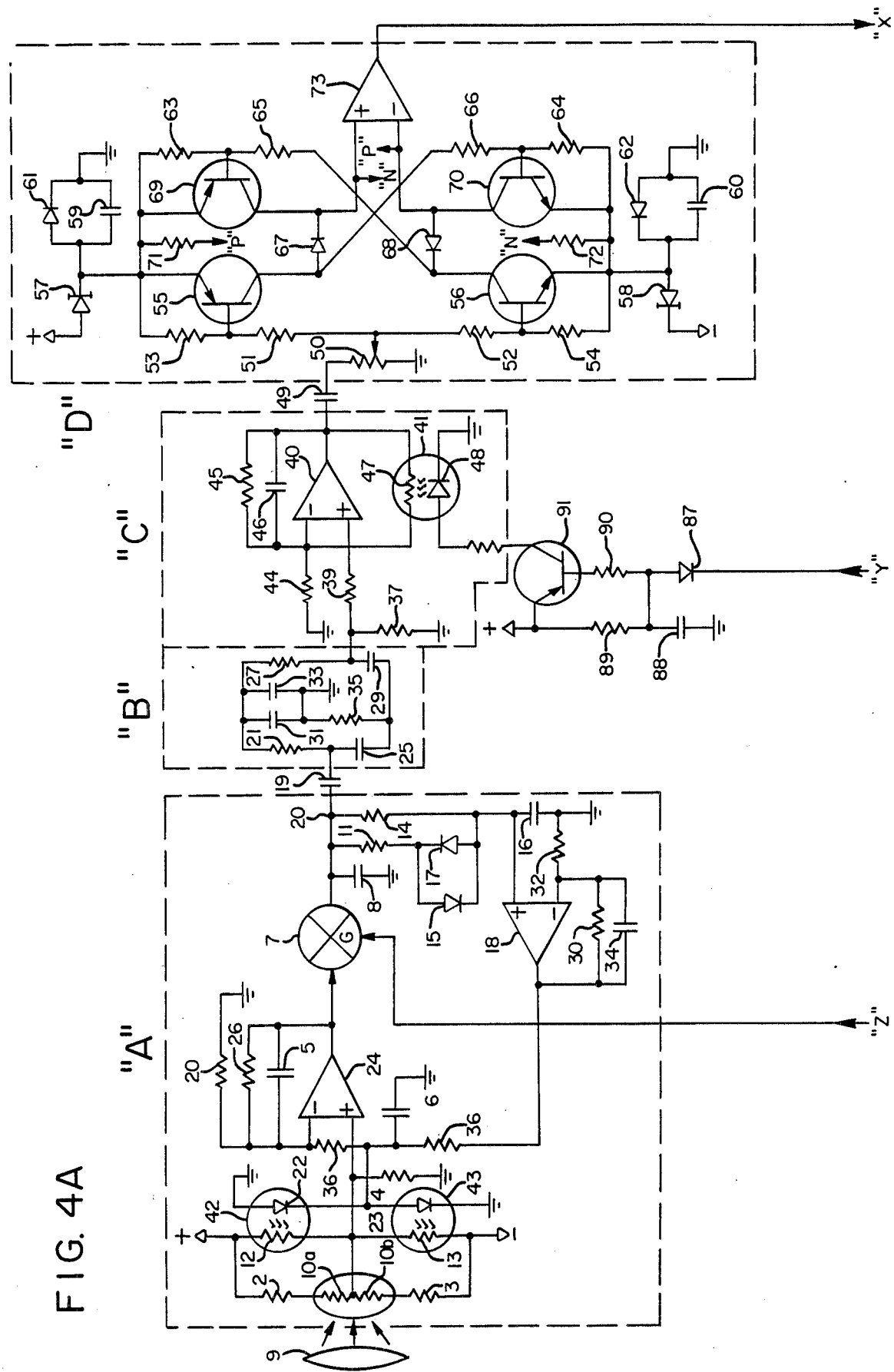
FIGS. 4A and 4B, combined together, is a preferred embodiment of the present invention, modified to permit use in a variety of monitoring situations.
Figure 4B:
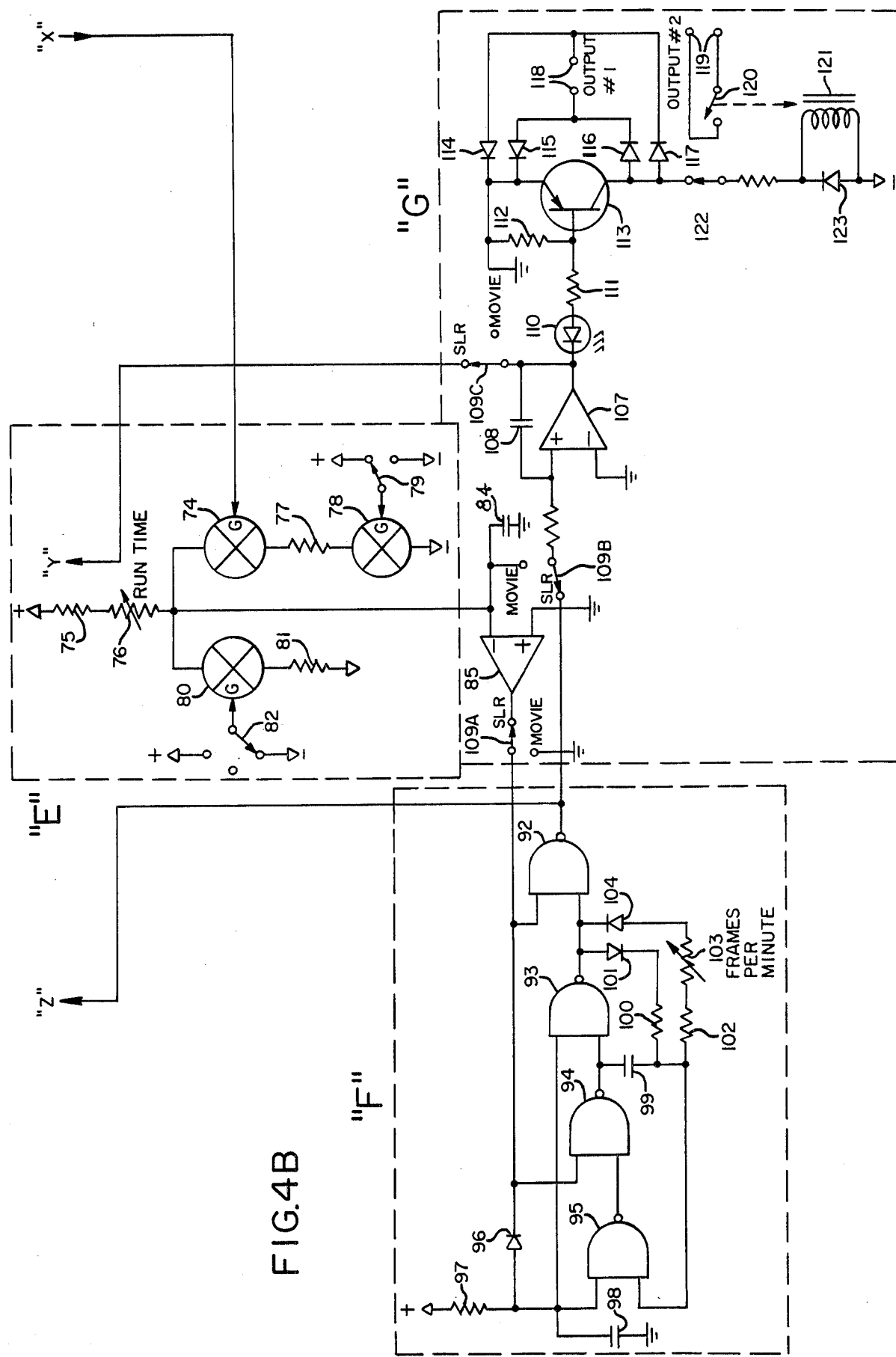

FIG. 4 discloses a detailed schematic of a preferred embodiment of the invention. Wherever possible, identifying numerals are the same as those used in FIGS. 1-3, for ease in identifying and understanding the operation of the embodiment.

The circuitry contained within the block enclosed by the dashed lines designated "A" is equivalent to the circuit disclosed in FIG. 3, described in detail hereinbefore.

The circuitry contained in the block enclosed by the dashed line designated "B" is a standard band-rejection filter, tuned to twice the power line frequency for rejecting signals generated by the response of the detector circuit in block "A" to the flickering of gaseous discharge lighting devices such as those used in florescent fixtures.

The circuitry contained in the block enclosed by the dashed line designated "C" is a novel variable-gain amplifier which functions to provide a hold-off action for subsequent circuits to the triggering signals generated by the operation of the circuit in block "A".

The circuitry contained within the block enclosed by the dashed line designated "D" is a novel combination pulse detector-trigger generator, operating from the pulse output of the circuit in block "C" and providing standarized output trigger pulses.

The circuitry contained within the block enclosed by the dashed line designated "E" is an "OR" gate, providing the potential for input or control from one or the other of any number of other sources.

The circuitry contained within the block enclosed by the dashed line designated "F" generates trigger signals for initiating a given number of exposures of a single lens reflex (SLR) camera.

The circuitry contained within the block enclosed by the dashed line designated "G" provides an interface between the cicuitry of the invention and the external circuitry or equipment operated thereby.

Those skilled in the art will recognize that components 42 and 43 in block "A" and 47 in block "C" are each composed of photoresistors 12, 13 and 14, respectively, and LEDs 22, 23, and 48, also respectively. These packaged combination LEDs and photoresistors are well-known in the art under such trade-designations as, for example, VTL2C2.

Component 7 in block "A" is a field effect transistor (FET) operated as a bilateral switch for the purpose of disabling the detector therein, as hereinafter more completely described. FET 7 is a standard commercial product, available under such trade designations as MC 14066 (Motorola) or 4014 (RCA), and has four of said switches incorporated in one package (the other three being components 74, 78 and 80, which will be dealt with as they are encountered in the circuit), although separate components could be used without departing from the spirit or intent of the invention.

When a negative potential is applied to switch 7, the feedback loop of the detector circuit is broken during the shutter actuation period of an SLR camera, as will be explained in greater detail hereinafter. Capacitor 8 holds the charge, or voltage level last seen before the actuation of FET 7, and helps prevent transient switching "spikes" that would otherwise be passed on to the following stages. Diodes 15 and 17 act to divert large signals around resistor 14, so that the circuit of the invention stabilizes more rapidly when it is first energized.

Capacitor 19 is a coupling capacitor to subsequent stages of the circuitry of the preferred embodiment.

The circuitry contained in block "B" is a standard band-rejection filter, well-known in the art, for rejecting spurious signals at twice power line frequency generated by the flickering of florescent and other gaseous discharge lighting devices.

The circuitry contained in block "C" is a variable gain amplifier which functions to provide a hold-off action to the triggering signal from block "A". Amplifier 40 is a standard voltage follower with gain, the gain being set, during normal operation, by the ratio of resistor 45 to resistor 44, which is approximately 50:1 in this preferred embodiment, although it could be any other ratio which gave satisfactory results, without departing from the spirit or intent of the invention, as will be recognized by those skilled in the art. It will be seen, however, that resistor 45 and amplifier 40 are paralleled by photoresistor 47, which is closely optically coupled to LED 48, which is, in turn, gated by a voltage waveform from a subsequent portion of the circuit, which gating waveform is initiated when the invention is used with an SLR type camera, wherein the viewing mirror is normally in the down (viewing) position except when the shutter is released. As will be seen by those skilled in the art, it would be undesirable for shutter release triggers from the detector circuit to be introduced to the camera during the operation of the shutter. Therefore, amplifier 40 is reduced in gain during this time from a factor of approximately 50 to a factor of approximately 0.3, by the activation of variable impedance device 47, disclosed herein as closely optically coupled photoresistor 47, disclosed herein as closely optically coupled photoresistor 47 and LED 48. Photoresistor 47, when not exposed to light, has a resistive value of approximately 20 megohms ($20 \times 10^6$), which is large with respect to the impedance of amplifier 40, measured from its negative input to its output, across resistor 45. On the other hand, when exposed to light, photoresistor 47 drops to a resistance which is low with respect to resistor 45, thereby reducing the gain as hereinbefore described. LED 48, which is activated in a manner hereinafter described in greater detail, is preferable packaged with photoresistor 48 as hereinbefore mentioned, although they could be separate elements without departing from the spirit or intent of the invention.

Capacitor 49 is a coupling capacitor from variable gain amplifier "C" to subsequent portions of the circuit.

The circuitry contained in block "D" is a novel circuit for providing trigger waveforms which are uniform in characteristics and polarity irrespective of the characteristics and polarity of the input waveform. The circuit of block "D" is a push-pull, two-stage, common-emitter amplifier followed by a comparator: push-pull for responding to input signals of either polarity; two-stage for added sensitivity and output energy; common-emitter for current amplification; and a comparator to provide the beginning and ending of the gating waveform whenever its input conditions are inverted. Comparator 73 is a bistable circuit which is normally in one state, but which transfers to the opposite state whenever the input voltages invert. The normal state of comparator 73 is to provide a low output voltage level, since the negative input is held positive by resistor 71, and the positive input shield negative by resistor 72, However, a positive signal at resistor 50 will bring transistor 56 into conduction, carrying its collector negative which, coupled through Schottky diode 67, brings the negative input to comparator 73 negative. At the same time, the base of transistor 69 is carried negative, which increases the voltage on the positive input to comparator 73, transferring it into its opposite state and providing a high output voltage level from the circuit.

Because of the push-pull nature of the circuit, with oppositely conductive elements operating under potentials of opposite polarity, a negative signal at resistor 50 will give the same end result: transistor 55 will be brought into conduction, carrying its collector positive which, coupled through Schottky diode 68, brings the positive input of comparator 73 positive. At the same time, the base of transistor 70 is carried positive, which decreases the voltage at its collector, carrying the negative input to comparator 73 negative and again transferring it into its opposite state, giving a high output voltage level from the circuit, in response to a negative signal at resistor 50.

The voltage swings from the amplifiers are limited to about 1.2 V by diodes 61 and 62, which act as batteries for the circuit, providing 0.6 V each on either side of ground potential, in the preferred embodiment. The current drawn by the circuit is limited to about 270 $\mu$A by the action of constant-current (field effect) diodes 57 and 58, which are well-known in the art as 1N5285, available from several sources.

The circuitry contained in block "E" is a more-or-less standard "OR" gate depicting one possible configuration of many that could be used to provide input and/or control by other circuits, or that could provide output of the preceeding circuits to other subsequent circuits. For example, the gating waveform from comparator 73 could be directed to other switches analogous to FET bilateral switch 74. Component 74 is one of four bilateral switches in a single package, as discussed hereinbefore in connection with component 7. All four are used for control purposes in different portions of the circuit of the preferred embodiment:

Switch 7 disables the feedback loop of the motion detector of block "A" during the SLR camera shutter operation, as explained in greater detail hereinafter;

Switch 74 is a gate for activating subsequent portions of the circuitry, as explained hereinafter in greater detail;

Switch 78 provides current to operate switch 74, or to disable it from an external source to prevent it from gating external equipment as intended and subsequently described; and Switch 80 can be set so as to allow the circuitry to operate as hereinbefore described, or respond to other external circuitry as described heretofore.

In order to explain the subsequent circuit functions, we will consider switch 78 to be set for internal operation: that is, to be connected to a positive voltage so that it will act as a current source for switch 74; and we will consider switch 80 to be turned off: that is, to be connected to a negative voltage so that it will have no effect on the current flowing through resistors 75 and 76, and thus on the operation of subsequent circuits. Variable resistor 76, in connection with capacitor 84, acts to provide an adjustable delay after switch 74 is turned off so that monitoring or recording equipment will continue to operate for a time if desired. A substantial range of adjustment can be obtained by selecting the proper relative values of 75 and 76.

Amplifier 85 is an ordinary direct-coupled inverting amplifier used as a comparator.

The circuitry contained within block "F" is a gated multivibrator which serves as an intervalometer providing trigger pulses for a given period to actuate an SLR camera used as an image recording device. The circuit will free-run whenever the voltage on the output of amplifier 85 is high, and the length of the running period is set by the RC combination of resistors 75 and 76 with capacitor 84. Resistor 76, as explained hereinbefore, provides a range of adjustment. The duration of the trigger pulses is set by the RC combination of capacitor 99, resistor 100 and diode 101. The period of the free-running cycle is set by the RC combination of capacitor 99, resistors 102 and 103, and diode 104. The desired range of adjustment is determined by the relative values of resistance 102 and 103.

The trigger pulses produced by block "F" at gate 92 perform several functions:

- They provide an actuating voltage to the trigger interface circuit of block "G" to actuate the shutter of an SLR camera (which lifts the viewing mirror out of the optical line-of-sight during shutter operation);
- They provide a gating voltage to switch 7 in block "A" to interrupt the feedback path during the time the viewing mirror is lifted, to prevent the feedback circuit from responding to the period of darkness produced thereby; and
- They serve to initiate the operation of variable amplifier 40 in block "C" to prevent the passage of trigger pulses during shutter actuation that might interfere with proper shutter operation.

When the output voltage of the multivibrator of block "F" goes negative, it opens the switch 7, opening the feedback path of the detector circuit of block "A", as hereinbefore described in connection with FIGS. 1-3, and especially in detail with reference to FIG. 3, where the feedback action of the preferred embodiment is described. It will be recognized by those skilled in the art that the photocell 10a and 10b will be subjected to a short period of darkness when the mirror of the SLR camera is lifted from the light path during an exposure and, if the switch 7 were not opened, a false indication of movement would be given. It will also be recognized by those skilled in the art that capacitor 8 performs the function of holding the terminal 20 at the voltage level existing immediately prior to exposure and simultaneous opening of the feedback loop, in order to prevent a false indication of movement during this time.

The circuitry contained within block "G" is a switch which interfaces between the external load and the circuit of the invention. Component 107 is a comparator similar in function and operation to comparator 73: that is, it provides a positive voltage to drive LED 110 and amplifier 113 whenever a negative voltage is present on its positive input. LED 110 indicates that trigger signals are being provided to operate external image recording devices whenever it is illuminated. Amplifier 113 provides current to full-wave rectifier circuit composed of diodes 114-117, and the output of the rectifier circuit provides the energy through terminals 118 to actuate the external equipment. If said equipment needs more electrical isolation than the rectifier circuit provides, it can be connected through output terminals 119. In this configuration, the external equipment is actuated by the closure of switch 120 when relay 121 is energized by the operation of amplifier 113, if switch 122 is closed. As can be seen, the detector circuit is totally isolated from the external equipment.

In this mode of operation (SLR), amplifier 91 is conducting, illuminating the LED portion of component 41, reducing the photoresistor portion in resistance and changing the variable-gain amplifier of block "C" into its attenuator mode, thus blocking the passage of trigger pulses which might occur during an exposure of the SLR camera. Capacitor 88 and resistor 89 form an RC network which extends the cutoff of amplifier 91 so that the gain of variable-gain amplifier 40 is slowly changed from its attenuation mode to its amplification mode, thus preventing any sudden change in output from block "C" from triggering pulse detector "D".

The foregoing description of the operation of the invention is predicted upon switch 109A-C being in SLR position. When switch 109A-C is switched to MOVIE position, the output of inverting amplifier 85 is disconnected from the input to intervalometer "F", which is connected to ground; the output of intervalometer "F" is disconnected from the input to comparator 107, clamping the switch 7 in closed condition; the output of switch 74 is connected to the input of comparator 107; and interfacing switch "G" will actuate external monitoring equipment, such as a movie or video recording camera just as described heretofore in connection with SLR mode of operation.

As will be recognized, many modifications can be made in the basic circuit without departing from the spirit or intent of the invention. For example, the circuit has been described in terms of semiconductor components: vacuum tube components could be used as easily; the circuit could be fabricated using integrated circuit technology or discrete elements; specific component numbers have been identified: others unnamed could be used as well, as long as the same or equivalent functions are performed; specific voltage, current, and/or impedance relationships have been identified: others could be used as well.

Further, different circuits could be used in some of the blocks than those named or described, except where the circuit itself is novel and claimed as such.

The terms and expressions which have been employed in the foregoing specification are used therein a terms of description and not of limitation, and there is no intention, in the use of such terms and expressions, of excluding equivalents of the features shown and described or portions thereof, it being recognized that the scope of the invention is defined and limited only by the claims which follow.

What I claim as my invention is:

1. In a photosensitive motion detector apparatus having first and second photosensitive devices in series and having a common connection, an operational amplifier having at least two inputs and an output, a low-pass filter having at least three terminals, a first light emitting unidirectional current device, an output terminal, said common connection being conected to said output terminal and to one of said at least three terminals of said low-pass filter, a second of said at least three terminals being connected to one of said at least two inputs of said operational amplifier, and a third of said at least three terminals being connected to another of said at least two inputs of said operational amplifier, said output of said operational amplifier being connected to said first light emitting unidirectional current device, and said second photosensitive device receiving substantially all the light output of said light emitting unidirectional current device and substantially no light from other sources, the improvement comprising:

a. said first photosensitive device having a first substantially identical photosensitive device in parallel therewith;

b. said second photosensitive device having a second substantially identical photosensitive device in parallel therewith;

c. said first substantially identical photosensitive device being in series with said second photosensitive device and said second substantially identical photosensitive device being in series with said first photosensitive device;

d. said first light emitting unidirectional current device having a second substantially identical unidirectional current device in parallel therewith, but in opposite polarity thereto and having a second common connection therewith connected to said output of said operational amplifier; and e. said second photosensitive device and said first substantially identical photosensitive device being closely optically coupled to said first and said second substantially identical light emitting unidirectional current devices, respectively.

2. The photosensitive motion detector apparatus of claim 1 wherein a low-impedance current source having at least two other inputs and a second output is inserted between said common connection and said output terminal, with one of said at least two other inputs being connected to said common connection and the other of said at least two other inputs being connected to said second common connection, and said second output being connected to said output terminal.

3. The photosensitive motion detector apparatus of claim 2 wherein a gating switch having a gating input is inserted between said second output and said output terminal.

4. In the photosensitive motion detector apparatus of claim 3, wherein output signals from said output terminal are used to actuate external monitoring and recording equipment, the improvement comprising:

a. trigger pulse generating means generating standardized trigger signals whenever said output signals from said output terminal are received therein;

b. holdoff means between said output terminal and said trigger pulse generating means for receiving and conducting said output signals to said trigger pulse generating means when said holdoff means is inoperative, said holdoff means having a holdoff actuating input;

c. interval generator means actuated by said standardized trigger signals and generating selectable frequency trigger signals for the period of said standardized trigger signals, said selectable frequency trigger signals being applied to said gating input of said gating switch;

e. interface means for providing appropriate interface between said interval generator means and monitoring and recording equipment actuated whenever said selectable frequency trigger signals are generated; and f. said interface means generating a holdoff actuation signal following actuation of said monitoring and recording equipment, said holdoff actuation signal being applied to said holdoff actuation input.

* * * * *